United States Patent [19]

Palmer

[11] Patent Number: 5,471,673
[45] Date of Patent: Nov. 28, 1995

[54] MULTIPLE RF CARRIER SYNTHESIZER

[76] Inventor: James K. Palmer, 134 Fel Mar Dr., San Luis Obispo, Calif. 93405

[21] Appl. No.: 188,019

[22] Filed: Jan. 28, 1994

[51] Int. Cl.$^6$ ............................. H04B 1/06; H04B 7/00; H03L 7/00
[52] U.S. Cl. ............................. 455/260; 331/16; 331/23; 331/34
[58] Field of Search ....................... 455/255, 257, 455/258, 259, 260, 63, 296, 108; 375/295, 259, 296, 297, 294, 346, 348; 331/16, 23, 34, 1 R Primary Examiner—Stephen Chin
Assistant Examiner—Hai H. Phan
Attorney, Agent, or Firm—Daniel C. McKown

[57] ABSTRACT

Circuitry for simultaneously generating a set of carriers having preselected frequencies in the amplitude modulation broadcast band includes a circuit for producing a train of pulses having a crystal-controlled pulse repetition frequency equal to the separation in frequency between successive assignable frequencies in the broadcast band, each pulse in the train having a pulsewidth approximately equal to the reciprocal of the frequency of the lower end of the broadcast band and having a rise time approximately equal to the reciprocal of the frequency of the upper end of the broadcast band, so that the spectrum of the train of pulses includes components having frequencies equal to all of the assignable frequencies in the broadcast band, the pulse train being applied to a set of phase-locked oscillators connected in parallel, each oscillator being tuned to a different one of the selected components of the train of pulses.

3 Claims, 2 Drawing Sheets

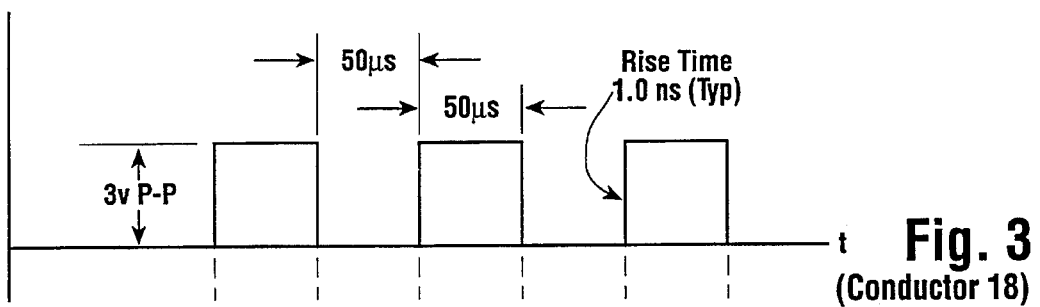
Fig. 3 (Conductor 18)
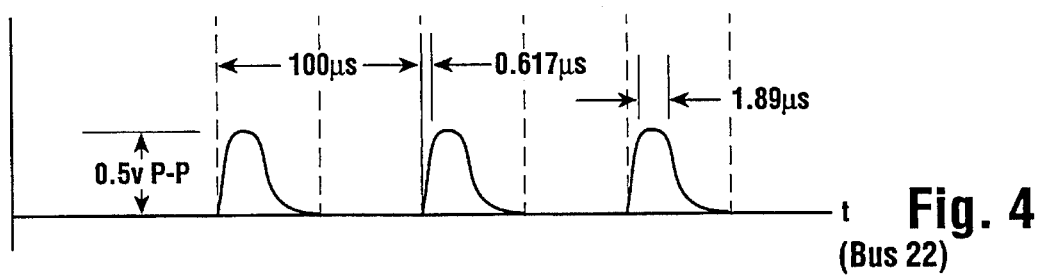
Fig. 4 (Bus 22)
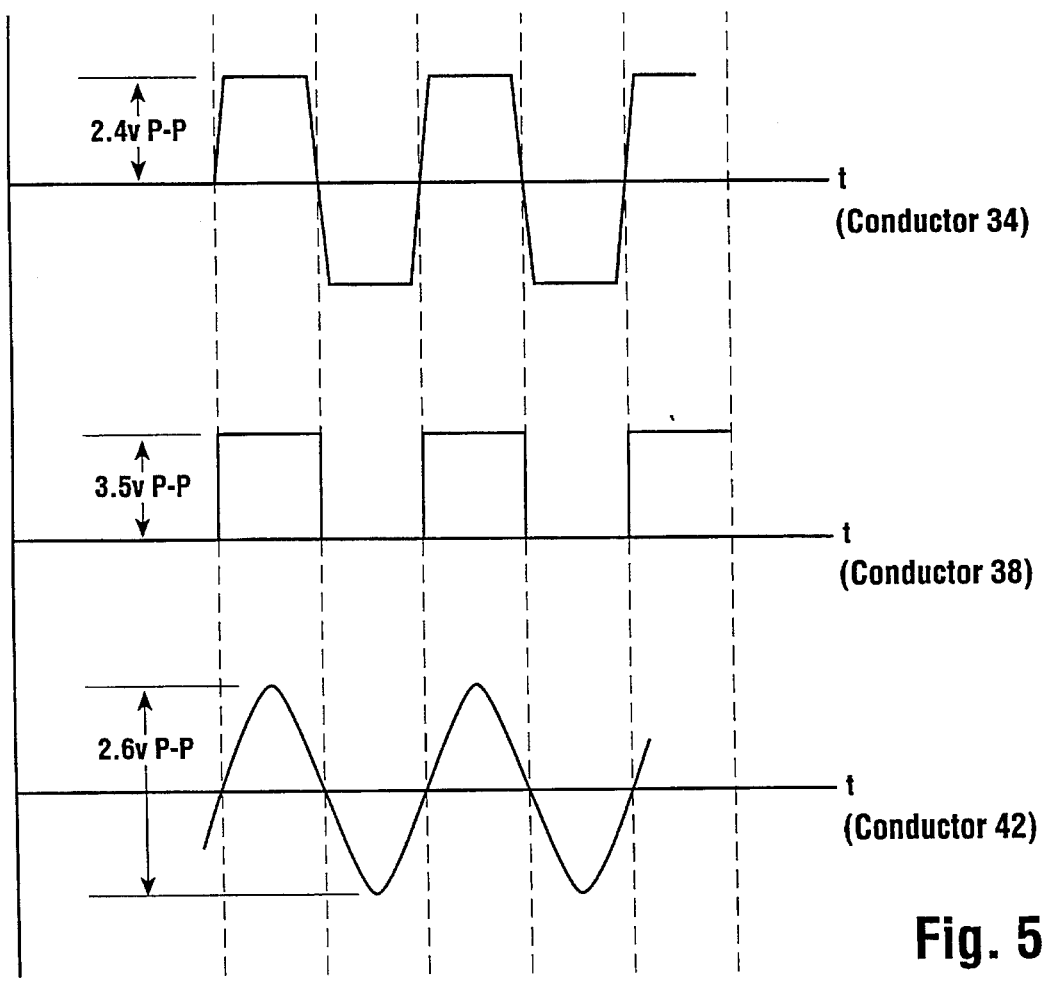
Fig. 5

MULTIPLE RF CARRIER SYNTHESIZER

BACKGROUND OF THE INVENTION

1. Field of the Invention

The present invention is in the field of radio and specifically relates to circuitry for simultaneously generating a set of carriers having preselected frequencies in the amplitude modulation (AM) broadcast band.

2. The Prior Art

At any particular geographic location, an AM radio receiver of ordinary sensitivity, such as those commonly found in homes and cars, can receive any one of a number of AM radio stations simply by tuning the receiver to the carrier frequency of the desired station.

The carrier frequency may be any frequency in the AM broadcast band starting at 530 KHz and increasing at 10 KHz intervals to 1620 KHz. To prevent interference, the frequencies in any particular geographic region are allocated by the Federal Communications Commission so as to be spaced much more than 10 KHz apart. The purpose of the present invention is to generate a set of carriers having frequencies equal to the carrier frequencies of all the stations that are receivable at a given location by a receiver of ordinary sensitivity. The composition of this set will vary with the location, so the apparatus of the present invention must be capable of producing any of the 110 possible carriers, which are separated by 10 KHz intervals across the AM broadcast band, even though at any particular location no more than perhaps a dozen carriers may be needed. The apparatus of the present invention must also be capable of adding or deleting carriers to the set generated as new stations are established, old stations are shut down, and as assigned frequencies are changed.

In principle, the purpose of the present invention could be accomplished by providing a number of tunable radio frequency oscillators, and by tuning one oscillator to each of the carrier frequencies that are receivable at the particular location. This approach is undesirable because the independent oscillators would require a large physical space and shielding to prevent field coupling. Further, most tunable oscillators do not have the frequency stability with respect to temperature changes that is required for this application. Finally, some means would have to be provided to equalize the amplitudes of the carriers.

The present inventor has found a simpler and better way of generating the desired set of carrier frequencies.

SUMMARY OF THE INVENTION

The main objective of the present invention is to generate a set of radio frequency carriers having predetermined frequencies and equal amplitudes.

A secondary objective is to generate a set of radio frequency carriers having a high degree of stability with respect to temperature changes.

Another secondary objective is to generate a set of radio frequency carriers by the use of low-cost components.

In accordance with the present invention, advantage is taken of the fact that in the AM broadcast band the frequency assignments are made at intervals of 10 KHz. In the present invention, a repeating pulse waveform is produced having a pulse repetition frequency of 10 KHz, having a pulsewidth of 1.89 microseconds, and having a rise time of less than 617 nanoseconds. This choice of waveform parameters assures, respectively, that the frequency separation of the spectral components will be 10 KHz, that the lowest frequency in the spectrum will be 530 KHz corresponding to the low frequency end of the AM broadcast band, and that the highest frequency in the spectrum will be 1620 KHz corresponding to the high frequency end of the AM broadcast band.

Specific spectral components are selected by applying the repeating pulse waveform to a number of phase-locked loop oscillators connected in parallel, each of which has a very narrow locking bandwidth and which therefore responds to only one of the desired specific frequencies.

In general, the amplitudes of the signals produced by the phase-locked loop oscillators will not be equal. The amplitudes are equalized by passing the output of each phase-locked loop oscillator through a digital buffer amplifier and then a low-pass filter. The latter imparts a sinusoidal wave shape to the output of the digital buffer amplifier.

The novel features which are believed to be characteristic of the invention, both as to organization and method of operation, together with further objects and advantages thereof, will be better understood from the following description considered in connection with the accompanying drawings in which a preferred embodiment of the invention is illustrated by way of example. It is to be expressly understood, however, that the drawings are for the purpose of illustration and description only and are not intended as a definition of the limits of the invention.

BRIEF DESCRIPTION OF THE DRAWINGS

FIG. 4 is a graph showing the signal output of the pulse shaper of FIG. 1; and,

FIG. 5 is a graph showing the signal at several points in FIG. 2.

DETAILED DESCRIPTION OF THE PREFERRED EMBODIMENT

The present inventor has addressed the problem of producing a plurality of single frequency waves suitable for use as amplitude modulation (AM) carriers having frequencies selected from a set of assignable frequencies uniformly spaced across the AM broadcast band.

Figure 1:
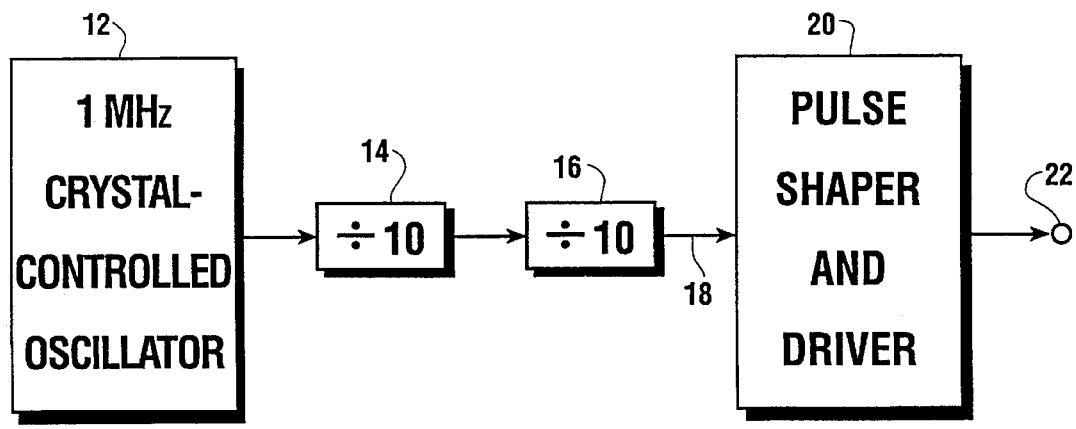
FIG. 1 is an electrical block diagram showing a spectrum generator circuit used in a preferred embodiment of the present invention.
Figure 2:
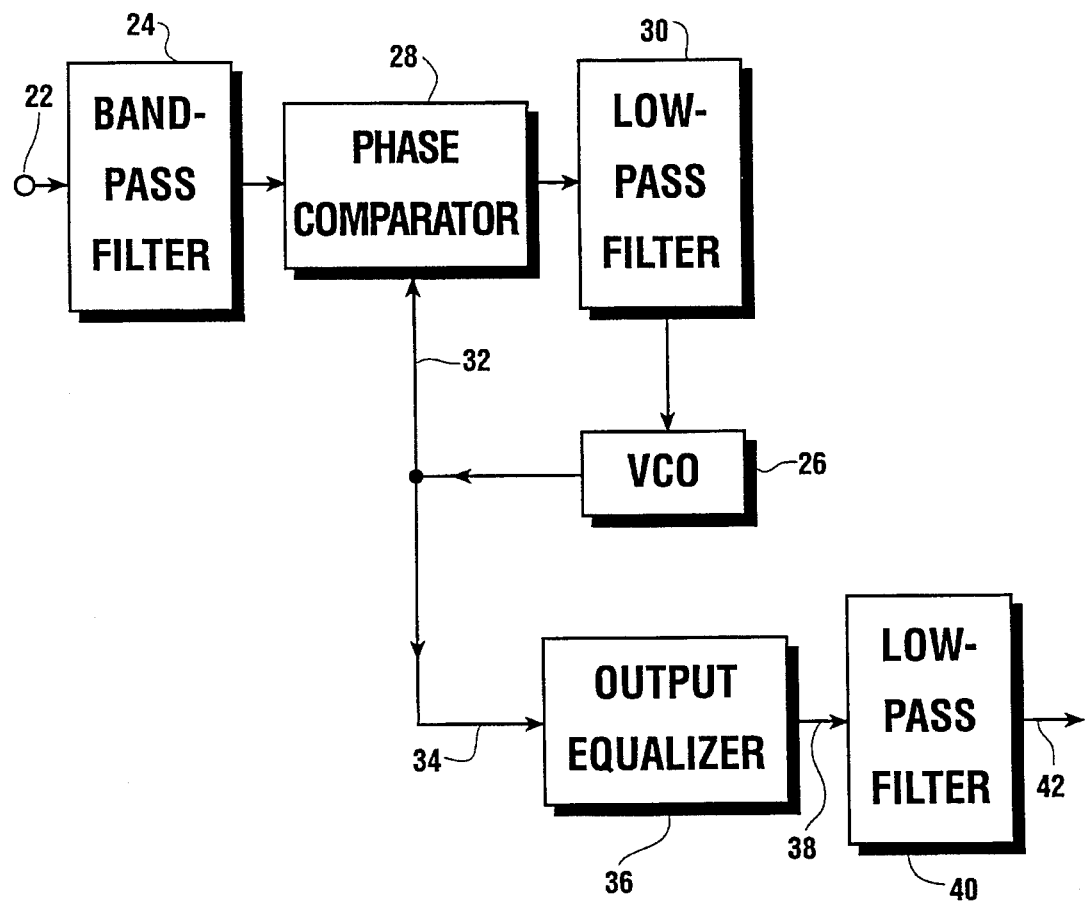
FIG. 2 is an electrical block diagram of a phase-locked oscillator used in a preferred embodiment of the present invention; and, FIG. 3 is a graph showing the signal input to the pulse shaper of FIG. 1.

Briefly, his solution to this problem consisted in providing a first circuit means, shown in FIG. 1, for producing a train of pulses whose spectrum includes components having frequencies equal to all of the assignable frequencies in the broadcast band, and in providing a plurality of second circuit means, each connected to the first circuit means and shown in FIG. 2, for respectively isolating the selected frequency components of the train of pulses and presenting the selected frequency components on separate conductors.

FIG. 1 is a block diagram showing the spectrum generator circuit used in a preferred embodiment of the invention. The purpose of the spectrum generator circuit of FIG. 1 is to generate an output signal, the spectrum of which includes components at each of the 110 specific assignable frequencies in the AM broadcast band. It will be recalled that these frequencies are equally spaced 10 KHz apart across the AM broadcast band that extends from 530 KHz to 1620 KHz. A crystal controlled oscillator 12 is used because the frequency of a crystal controlled oscillator is quite stable with respect to temperature fluctuations. A 1.0 MHz crystal is used because such crystals are readily available and are quite inexpensive. The output of the crystal controlled oscillator 12 is counted down by two successive factors of 10 in the counters 14 and 16 respectively so that a 10 KHz square wave is presented on the conductor 18 to the pulse shaper 20. Thus, the input to the pulse shaper 20 has a precisely controlled pulse repetition rate which results ultimately in precise maintenance of the 10 KHz spacing between the successive spectral components of the output of the pulse shaper 20.

The purpose of the pulse shaper and driver, which includes a monostable multivibrator, is to convert the square pulses on the conductor 18 into a train of pulses having desired rise time and pulse width. It will be recalled that the rise time of the pulses produced by the pulse shaper 20 determines the upper extent of the frequency components, and this should correspond to 1620 KHz. Accordingly, the pulse shaper 20 must produce pulses having a rise time of approximately 0.617 microseconds. Also, it will be recalled that the width of the pulses produced by the pulse shaper 20 determines the lower extent of the frequency components, which should coincide with the lower end of the AM broadcast band; i.e., 530 KHz. Accordingly, the width of the pulses produced by the pulse shaper 20 should be approximately 1.89 microseconds. Thus, the pulse shaper 20 applies to the bus 22 a train of pulses having a crystal-controlled pulse repetition frequency of 10 KHz, having a rise time of 0.617 microseconds and having a pulse width of 1.89 microseconds. Because of this choice of the parameters of the train of pulses, the spectrum of the train of pulses includes all of the assignable carrier frequencies within the AM broadcast and substantially nothing else.

As mentioned above, at any particular geographic location only a relatively small number, perhaps a dozen, of AM stations can actually be received by an ordinary receiver. Thus, to provide substitutes for those stations requires that a dozen or so of the 110 available carriers be selected. In accordance with the present invention, the selection of the desired carriers is accomplished by providing a number of phase-locked oscillator circuits of the type shown in FIG. 2, each connected to the bus 22.

In the carrier selector circuit of FIG. 2, the composite signal from the bus 22 is passed through the bandpass filter 24, the purpose of which is to prevent the phase-locked oscillator from inadvertently locking onto a harmonic of the selected frequency. A periodic waveform is generated by the voltage controlled oscillator (VCO) 26 and is applied via the conductor 32 to the phase comparator 28, where its phase is compared with that of the output of the bandpass filter 24. The phase difference is applied through the low-pass filter 30 to the voltage controlled oscillator 26 to correct its frequency so as to render the frequency of the signal produced by the VCO 26 equal to the frequency of the carrier selected. A voltage having this single frequency is thus present on the conductor 34.

The signal on the conductor 34 may differ in amplitude from one phase-locked oscillator circuit to the next, and the signal on the conductor 34 will probably not have a sinusoidal wave shape. For these reasons, the signal on the conductor 34, shown on the upper graph of FIG. 5, is applied to the output equalizer circuit 36, which consists of a digital buffer amplifier in the preferred embodiment, and which produces a square wave of constant amplitude, shown on the middle graph of FIG. 5, for all of the carrier selector circuits. The square wave output of the output equalizer 36 is then applied to a low-pass filter 40 that eliminates its higher frequency components thereby reducing the output signal on the conductor 42 shown on the lower graph of FIG. 5, to a close approximation of a sinusoidal wave that has the frequency of a selected one of the assignable carriers of a AM broadcast band. The amplitude of the carriers produced by the several selector circuits of FIG. 2 are all equal because all of the digital buffer amplifiers limit the amplifiers to the same voltage.

FIGS. 3-5 show the waveforms of the signals on various conductors throughout the circuits of FIGS. 1 and 2.

In particular, FIG. 3 shows, for the preferred embodiment, the train of pulses produced on the conductor 18 of FIG. 1. As noted in FIG. 3, the pulses that compose this train of pulses have a width of 50 microseconds, a spacing of 50 microseconds, and a rise time of 1.0 nanosecond.

FIG. 4 shows how each of the pulses of FIG. 3 has been modified by the pulse shaper 20 of FIG. 1. The pulse train shown in FIG. 4 is present on the bus 22 of FIGS. 1 and 2.

FIG. 5 shows the waveforms present on the conductors 34, 38 and 42 of FIG. 2 in the preferred embodiment, as noted above.

Thus, there has been described a circuit for producing as outputs a number of selected carriers from the AM broadcast band. The frequencies of these selected carriers are crystal stabilized, and the amplitudes of the carriers are substantially equal.

The foregoing detailed description is illustrative of one embodiment of the invention, and it is to be understood that additional embodiments thereof will be obvious to those skilled in the art. The embodiments described herein together with those additional embodiments are considered to be within the scope of the invention.

What is claimed is:

1. A circuit for producing a plurality of single frequency waves suitable for use as amplitude modulation carriers having frequencies selected from a set of assignable frequencies uniformly spaced across a broadcast band, said circuit comprising in combination:

first means for producing a train of pulses having a pulse repetition frequency equal to the separation in frequency between successive assignable frequencies in the broadcast band, each pulse having a pulsewidth approximately equal to the reciprocal of the frequency of the lower end of the broadcast band and each pulse having a rise time approximately equal to the reciprocal of the frequency of the upper end of the broadcast band, wherein the spectrum of said train of pulses includes components having frequencies equal to all of the assignable frequencies in the broadcast band; and, second means connected to said first means for isolating selected frequency components of said train of pulses and for presenting the selected frequency components on separate conductors.

2. A circuit for producing a plurality of carriers having crystal controlled radio frequencies selected from a set of assignable frequencies that are uniformly spaced across the amplitude modulation (AM) broadcast band, said circuit comprising:

a crystal controlled oscillator that produces a pulse train having a closely-controlled pulse repetition frequency related to the separation in frequency of the assignable frequencies;

a pulse shaper connected to said crystal controlled oscillator for producing in response to each pulse in said pulse train a shaped pulse having a specified rise time related to the high frequency end of the AM band and having a specified pulsewidth related to the low frequency end of the AM band, and for applying the shaped pulses to a bus;

a phase-locked oscillator connected to said bus for generating a periodic waveform having a frequency equal to that of a preselected one of the carriers;

a signal leveler connected to said phase-locked oscillator for producing a square wave of constant amplitude and of frequency equal to that of a preselected one of the carriers; and, a low-pass filter connected to said signal leveler and responsive to said square wave of constant amplitude for producing a waveform approximating a sine wave of frequency equal to that of a preselected one of the carriers.

3. A method of producing a plurality of single frequency waves suitable for use as amplitude modulation carriers having frequencies selected from a set of assignable frequencies uniformly spaced across a broadcast band, said method comprising the steps of:

a) producing a train of pulses having a pulse repetition frequency equal to the separation in frequency between successive assignable frequencies in the broadcast band, each pulse having a pulsewidth approximately equal to the reciprocal of the frequency of the lower end of the broadcast band and each pulse having a rise time approximately equal to the reciprocal of the frequency of the upper end of the broadcast band, wherein the spectrum of said train of pulses includes components having frequencies equal to all of the assignable frequencies in the broadcast band; and, b) applying the train of pulses to a plurality of phase-locked oscillators each responsive to a different one of said frequencies selected from a set of assignable frequencies to produce an output consisting of a single one of the selected frequencies.

* * * * *